United States Patent [19]

Nanba et al.

[11] Patent Number: 4,496,834
[45] Date of Patent: Jan. 29, 1985

[54] FOCUS DETECTING PHOTOELECTRIC DEVICE AND FOCUS DETECTING SYSTEM

[75] Inventors: Yasuhiro Nanba, Sennan; Takayuki Gotoh, Minamikawachi; Eiji Yamakawa; Toshihiko Karasaki, both of Sakai, all of Japan

[73] Assignee: Minolta Camera Kabushiki Kaisha, Osaka, Japan

[21] Appl. No.: 366,080

[22] Filed: Apr. 6, 1982

[30] Foreign Application Priority Data

Apr. 7, 1981 [JP] Japan ................................ 56-52561

[51] Int. Cl.³ ............................................. H01J 40/14
[52] U.S. Cl. .................................. 250/211 R; 250/578
[58] Field of Search ................. 250/211 J, 211 R, 578, 250/201; 357/2, 30, 31, 32; 354/402, 404, 409

[56] References Cited

U.S. PATENT DOCUMENTS 4,341,954 7/1982 Mizushima et al. ............. 250/211 J
4,347,436 8/1982 Fukuda et al. ...................... 250/578
4,415,246 11/1983 Karasaki et al. .................... 250/578
4,419,696 12/1983 Hamano et al. .................. 250/211 J Primary Examiner—David C. Nelms
Assistant Examiner—Jere J. Brophy
Attorney, Agent, or Firm—Wenderoth, Lind & Ponack

[57] ABSTRACT

A focus detecting photoelectric device includes a plurality of photodiodes each formed by an amorphous silicon layer sandwiched between transparent and non-transparent electrodes. The photodiodes are provided in pairs and are aligned in an array and deposited on a glass plate such that the transparent electrode is directly mounted on the glass plate. The photodiodes in a pair are located closely adjacent to, but in a spaced relation with, each other and are electrically connected in series to each other. An image formed on the photodiodes in a pair effects the generation of photocurrent from the photodiodes such that the photocurrents from both photodiodes are approximately the same when the image is out of focus, and they vary from each other as the image becomes sharp.

33 Claims, 21 Drawing Figures

4,496,834

FOCUS DETECTING PHOTOELECTRIC DEVICE AND FOCUS DETECTING SYSTEM

BACKGROUND OF THE INVENTION

1. Field of the Invention

The present invention relates to a focus detecting photoelectric device and, more particularly, to an improvement in the arrangement of a focus detecting photoelectric device. It also relates to a focus detecting system, employing the improved focus detecting photoelectric device, for use in an automatic focus control system of a photographic or television camera, or the like.

2. Description of the Prior Art

In general, the spatial frequency of the light which makes up an image projected through an objective lens assembly is known to have such properties that, when the image is sharply focused on an image plane of the objective lens assembly an amplitude of an a.c. component on the image plane attains a maximum value and that the amplitude of the spatial frequency varies considerably when the spatial frequency in question is within a relatively high frequency range. Various spatial filters, or focus detecting photoelectric devices of contrast detecting type, utilizing the above described properties have heretofore been developed.

In order to detect the high frequency component of brightness of the image, it is necessary to dispose a plurality of light sensors regularly on a plain side-by-side to each other to define an array of light sensors, and at the same time, the distance between the neighboring two sensors should be as small as possible to obtain the a.c. signal with a high frequency. From this point of view, it is concluded that the focus detecting photoelectric device can be formed on a plain substrate.

According to the conventional focus detecting photoelectric devices an in-focus signal is obtained by taking a difference in outputs received from two sensors located next to each other, or every other sensor positions. To meet this end, the sensors, which are formed by silicon photodiodes on a single integrated circuit, are connected in series with each other, and a junction between two sensors is connected to an external circuit which receives a current representing a difference between the photocurrents generated in the two sensors. The detail of this arrangement and its drawback are described below with reference to FIGS. 1 and 2.

In FIG. 1, two silicon photodiodes shown are formed on an n-type single crystal silicon base N0. The first silicon photodiode PDa is defined at a junction between n-type layer N1 and p-type layer P1, and the second silicon photodiode PDb is defined at a junction between n-type layer N2 and p-type layer P2. An electrode is mounted on each of layers N1, P1, N2 and P2, so as to electrically connect layer N1 with a source of positive voltage through a terminal T1, layer P1 with layer N2, and layer P2 with a source of negative voltage through a terminal T3. A junction between the layers P1 and N2 are further connected to a terminal T2 for the external connection. The above connection presents a series connection of two photodiodes PDa and PDb between the positive and negative voltage sources.

In addition to the above, in order to electrically separate the photodiodes on the silicon base N0, an insulation layer N3 is formed between the photodiodes PDa and PDb. The employment of such an insulation layer N3, however, results in the formation of unwanted photodiodes PDx and PDy parasitically between the layer P1 and the base N0 and between the layer P2 and the base N0. Therefore, when light beams impinge as shown by arrows on the focus detecting photoelectric device described above, photocurrents are generated at the photodiodes PDa and PDb, and also at the photodiodes PDx and PDy, as explained below.

Referring to FIG. 2, there is shown an equivalent circuit of the focus detecting photoelectric device of FIG. 1. As understood from the drawing, the photodiodes PDa and PDb are connected in series and are reversely biased by a power source (not shown).

When the image is sharply focused on the detecting photoelectric device, the brightness of the image varies greatly between various points on the image. Assuming that the photodiode PDa is receiving lights which are brighter than those on the photodiodes PDb, the photodiodes PDa and PDb generate photocurrents ip1 and ip2 which are in relation to the brightness of the impinged light, respectively. Since the lights impinging on the photodiode PDa is brighter, the generated photocurrent ip1 is greater than the photocurrent ip2. Therefore, a current difference ip1−ip2 therebetween flows outwardly from the junction between the photodiodes PDa and PDb towards an external circuit connected to the terminal T2. In this case, since the parasitic photodiodes PDx and PDy are also receiving the lights, and since the photodiodes PDx and PDy are, respectively, connected forward and reversely with respect to the difference current ip1−ip2, some percentage of the difference current ip1−ip2 leak out through the parasitic photodiodes PDx and PDy towards the terminal T3 when the parasitic photodiode PDy is receiving light. Thus, a true difference current ip1−ip2 can not be applied to the external circuit.

On the other hand, if the photodiode PDb is receiving lights which are brighter than those on the photodiodes PDa, the generated photocurrents are such that the photocurrent ip1 is smaller than the photocurrent ip2. Thus, a difference current ip2−ip1 flows into the junction between the photodiodes PDa and PDb from the external circuit through the terminal T2. In this case, an additional current caused by the parasitic photodiode PDy flows through the terminal T2 from the external circuit, when the parasitic photodiode PDy is receiving light brighter than that on the parasitic photodiode PDx. Thus, a correct difference current ip2−ip1 can not be derived from the external circuit.

Furthermore, when the image formed on the focus detecting photoelectric device is out of focus, the image is vague, and thus the brightness of the image is approximately the same between two neighboring portions where the photodiodes PDa and PDb are located. Assuming that the light beams having the same brightness are impinging on the photodiodes PDa and PDb, no difference current is generated and, thus no current will flow through the terminal T2 from or towards the external circuit. However, in this case, by the lights impinging on the photodiode PDy, current path is established through the photodiodes PDx and PDy towards the terminal T3 for effecting the current flow from the external circuit through the terminal T2, photodiodes PDx and PDy to the terminal T3.

According to the conventional focus detecting photoelectric device as described above, parasitically formed photodiodes PDx and PDy produce, when they receive lights, unwanted photocurrents which adversely affect difference current generated between the photodiodes PDa and PDb. Thus, the conventional focus detecting photoelectric device fails to provide an exact difference current to the external circuit, which detects the degree of focus by the use of the difference current. Therefore, for the focus detecting photoelectric device formed by the single crystal silicon substrate N0, there is a limit in the accuracy of detection.

Furthermore, according to the focus detecting photoelectric device described above, it is necessary to provide an insulation layer N3 between the photodiodes PDa and PDb to effect the serial connection of the photodiodes PDa and PDb. When such an insulation layer N3 is narrow in the distance between the photodiodes PDa and PDb, the parasitic photodiodes PDx and PDy generate the photocurrent greatly and, thus the insulation layer N3 should have a width greater than a certain width. Such a wide insulation layer N3, however, results in a wide space between the neighboring two photodiodes PDa and PDb. Thus, the spatial frequency of a sampled a.c. signal necessary for the focus detection is limited to a certain level.

The above described focus detecting photoelectric device is disclosed in detail in U.S. Pat. No. 4,039,824 to Nanba issued Aug. 2, 1977, and a similar focus detecting photoelectric device is disclosed in Japanese Patent laid open to public (Tokkaisho) No. 52-70829.

SUMMARY OF THE INVENTION

The present invention has been developed with a view to substantially solving the above described disadvantages and has for its essential object to provide an improved focus detecting photoelectric device which employs an array of amorphous silicon photodidoes so that the device can detect the focus condition with a high accuracy.

It is also an essential object of the present invention to provide a focus detecting photoelectric device which is compact in size and can readily be manufactured at low cost.

In accomplishing these and other objects, a focus detecting photoelectric device according to the present invention comprises a substrate formed by an electrically non-conductive material and at least two first and second photodiodes deposited side-by-side to each other on the substrate. Each of the photodiodes comprises a first electrode layer deposited directly on the substrate, an amorphous silicon layer deposited on the first electrode layer, and a second electrode layer deposited on the amorphous silicon layer such that the amorphous silicon layer is sandwiched between the first and second electrode layers. The focus detecting photoelectric device further comprises means for electrically connecting the first and second photodiodes in series to each other. The second electrode layer or a combination of the first electrode layer and the substrate is formed by transparent material for permitting impingement of lights onto the amorphous silicon layer.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIGS. 3b and 3c are cross-sectional views taken along lines IIIb—IIIb and IIIc—IIIc, respectively, shown in FIG. 3a;

FIG. 4 is a circuit diagram showning an equivalent circuit of the device of FIG. 3a;

FIGS. 7b and 7c are cross-sectional views taken along lines VIIb—VIIb and VIIc—VIIc, respectively, shown in FIG. 7a;

FIGS. 8a, 8b, 8c and 8d are top plan views showing steps for forming the focus detecting photoelectric device of FIG. 7a;

FIG. 9 is a circuit diagram showing an equivalent circuit of the device of FIG. 7a;

FIG. 10 is a circuit diagram showning an external circuit to be connected to the focus detecting photoelectric device of FIG. 7a;

FIG. 13 is a diagrammatic view of a focus detecting system employing the focus detecting photoelectric device of FIG. 3a or 7a.

DESCRIPTION OF THE PREFERRED EMBODIMENTS

Figure 1:
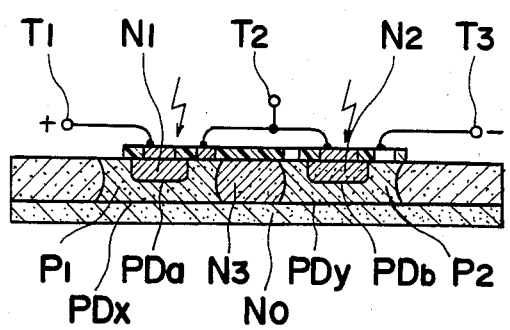
FIG. 1 is a cross-sectional view of a focus detecting photoelectric device according to the prior art.
Figure 2:
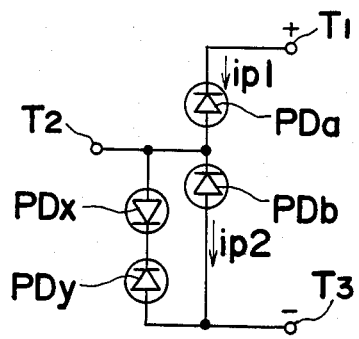
FIG. 2 is a circuit diagram showing an equivalent circuit of the device of FIG. 1.
Figure 3A:
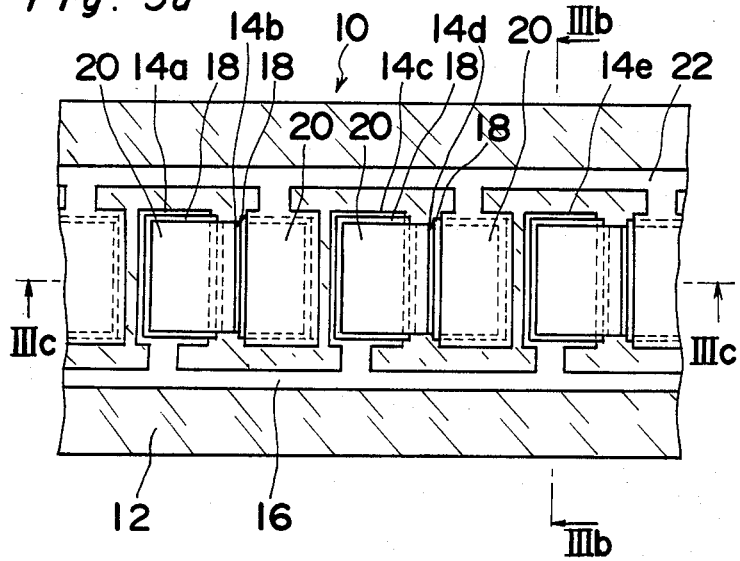
FIG. 3a is a top plan view of a first embodiment of a focus detecting photoelectric device according to the present invention.
Figure 3B:
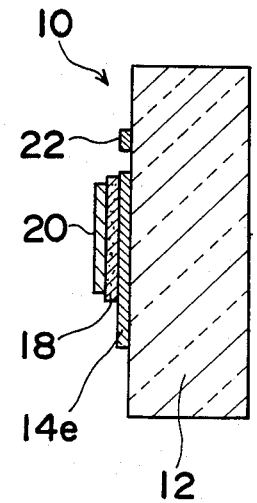
Figure 3C:
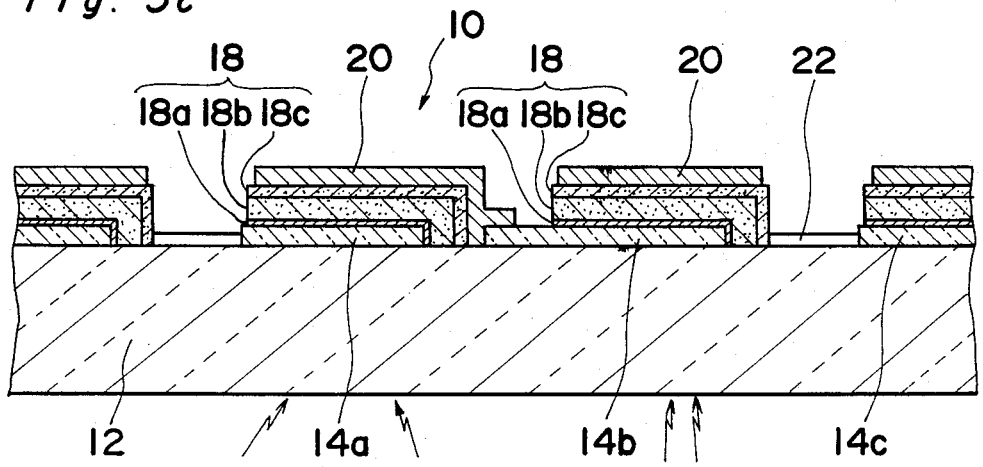

Referring particularly to FIGS. 3a, 3b and 3c, there is shown a focus detecting photoelectric device 10 according to the first preferred embodiment. The focus detecting photoelectric device 10 comprises a transparent substrate, such as a glass plate, 12 having an elongated rectangular configuration.

Deposited firstly on the glass plate 12 are a plurality of transparent electrodes $14a$, $14b$, $14c$, $14d$, $14e$, and so on, formed by, e.g., an ITO layer ($In_2O_3$-$SnO_2$)5, and each having a rectangular configuration. The transparent electrodes $14a$, $14b$, ... are aligned in an array along the longitudinal direction of the glass plate 12 in pairs ($14a,14b$; $14c,14d$; ...) with a predetermined distance spaced between the pairs, and with another predetermined distance spaced from each other in each pair. The every other transparent electrodes $14a$, $14c$, $14e$, ..., that is the first electrodes in each pairs, are electrically connected with each other by a narrow straight electrode (referred to as a runner electrode) 16 deposited on the glass plate 12 on one side of the array.

Thereafter, on each transparent electrode, e.g., $14a$ an amorphous silicon layer 18 comprising p-type layer $18a$, i-type layer $18b$ and n-type layer $18c$ is deposited. The p-type layer $18a$ is deposited under an atmosphere having a mixture of silane ($SiH_4$) and diborane ($B_2H_4$), the i-type layer $18b$ under an atmosphere of silane ($SiH_4$), and the n-type layer $18c$ under an atmosphere having a mixture of silane ($SiH_4$) and phosphine ($PH_3$). When depositing the amorphous silicon layer 18 on the transparent electrodes 14b, 14d, . . . which are not connected with the runner electrode 16, it is necessary to remain, when viewed in FIG. 3a or 3c, a left-hand side portion uncovered. A further detail of the amorphous silicon layer is disclosed in an article "Amorphous Silicon Solar Cell and Integrated Cell Module" by Yukinori Kuwano in "JOURNAL OF ELECTRONIC ENGINEERING" volume 17, No. 167, pages 72 to 78, issued Nov. 1980.

Then, non-transparent electrode 20 formed by, e.g., an aluminum layer is deposited on each amorphous silicon layer 18 by the step of, for example, vacuum deposition.

It is to be noted that the aluminum layers 20 deposited above the transparent electrodes 14a, 14c, . . . which are connected with the runner electrode 16 extend over the uncovered portion of the neighboring transparent electrode so that the non-transparent electrode 20 is electrically connected to the transparent electrode 14 positioned next in the right in FIG. 3a or 3c.

It is also to be noted that the non-transparent electrodes deposited above the transparent electrodes 14b, 14d, . . . , which are not connected with the runner electrode 16 are electrically connected with each other by another runner electrode 22 deposited on the glass plate 12 parallelly to the runner electrode 16 on the other side of the array.

As understood to those skilled in the art, one photodiode is formed by the amorphous silicon layer 18 sandwiched between transparent and non-transparent electrodes 14 and 20. Thus, by the above arrangement, an array of a plurality of photodiodes in pairs is formed on the glass plate 12, and each photodiode reacts to lights that pass through the glass plate 12, as shown by arrows in FIG. 3c.

It is to be noted that the photodiodes in a pair should have the same photoelectric characteristic to each other. It is also to be noted that so long as the photodiodes in a pair are located closely adjacent to each other, the photodiodes can be deposited on the glass plate 12 in disorder.

Figure 4:
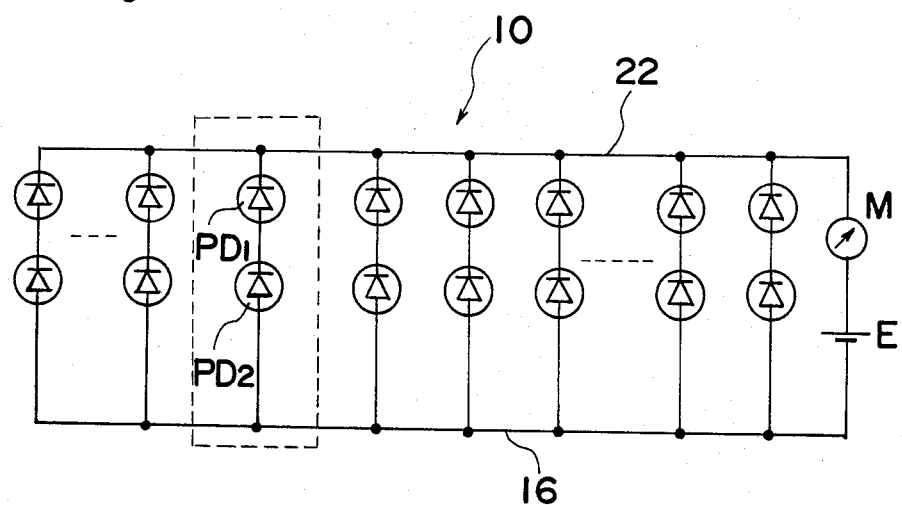

An equivalent circuit of the above described photodiode array is shown in FIG. 4, together with a reverse bias voltage source E and a current meter M for measuring currents generated by the photodiodes. A pair of photodiodes PD1 and PD2 shown in FIG. 4 in a dotted line block can be considered as corresponding to photodiodes formed with transparent electrodes 14a and 14b, respectively, in FIG. 3a or 3c. As apparent from FIG. 4, the photodiodes in each pair are connected in series to each other with poles directing the same direction between the runner electrodes 16 and 22, and the photodiodes in pairs are connected parallelly to each other between the runner electrodes 16 and 22.

Next, the operation of the focus detecting photoelectric device 10 described above is explained.

When an image is formed on the focus detecting photoelectric device 10 a current is generated from each photodiode with an amount of the current being in relation to the brightness of an image section impinging on each photodiode.

If the image on the focus detecting photoelectric device 10 is out of focus, the image is vague and, therefore, a contrast between two neighboring sections on the image is very weak or zero. In this case, the brightness of the image on the photodiode PD1 is approximately the same as that on the photodiode PD2 and, therefore, the photocurrent generated from the photodiodes PD1 and PD2 are approximately the same.

If, on the contrary, the image on the focus detecting photoelectric device 10 is sharp, a contrast between two neighboring sections on the image is very high. In this case, the brightness of the image on one photodiode, e.g., PD1 is greater than that on the other photodiode. Therefore, a photocurrent generated from the photodiode PD1 is relatively high and that from the photodiode PD2 is relatively low. Since the photodiodes PD1 and PD2 are connected in series with each other, a current that flows through the photodiodes PD1 and PD2 is restricted to low level current.

Figure 5:
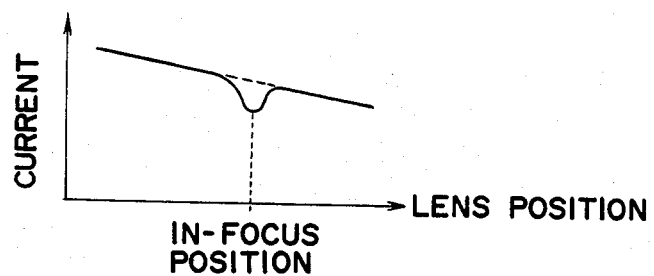
FIG. 5 is a graph showing a waveform of output obtained from the circuit of FIG. 4.

Therefore, as the image becomes sharp, a current produced from each pair of photodiodes becomes small and, therefore a total current that flows through the current meter M becomes small. Thus, the total current measured by the current meter M will be minimum when the image is focused most sharply on the photodiode array, i.e., on the focus detecting photoelectric device 10. A graph of FIG. 5 shows a change of output signal obtained from the current meter M relative to the change of focus of the image on the focus detecting photoelectric device 10, in which abscissa and ordinate represent, respectively, lens position and total current measured by the current meter M. The waveform shows a minimum value at a point where the lens focuses the image most sharply, and such a feature in the waveform is generally called a dip-effect. In FIG. 5, the current detected by the current meter M slopes down as the lens shifts away from the photodiode array 10. This is because the available, or effective, aperture size is reduced relative to the shift of the lens away from the photodiode array 10. Therefore, in a case where the lens shifts widely, it is preferable to detect the dip point rather than the minimum point for finding the in-focus position of the lens.

Figure 6:
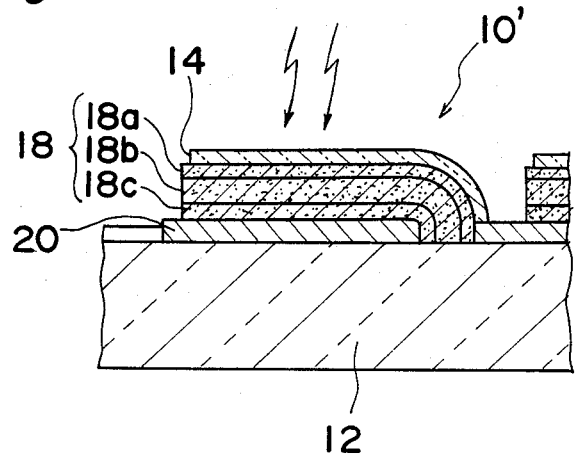
FIG. 6 is a view similar to FIG. 3c but particularly showing a modification thereof.

Referring to FIG. 6, there is shown a focus detecting photoelectric device 10' which is a modification of the device shown in FIG. 3c. According to the arrangement of the FIG. 3c, the transparent and non-transparent electrodes 14 and 20 are provided such that the transparent electrode 14 is deposited directly on the glass plate 12 and the non-transparent electrode 20 is deposited on the amorphous silicon layer 18. In contrast to this, according to the modification shown in FIG. 6, the relation is opposite, that is, the non-transparent electrode 20 is deposited directly on the glass plate 12 and transparent electrode 14 is deposited on the amorphous silicon layer 18. When the arrangement according to FIG. 6 is employed, it is possible to receive light by the amorphous silicon layer 18 through the transparent electrode 14. Furthermore, in this case, it is possible to replace the glass plate 12 with a non-transparent substrate.

Figure 7A:
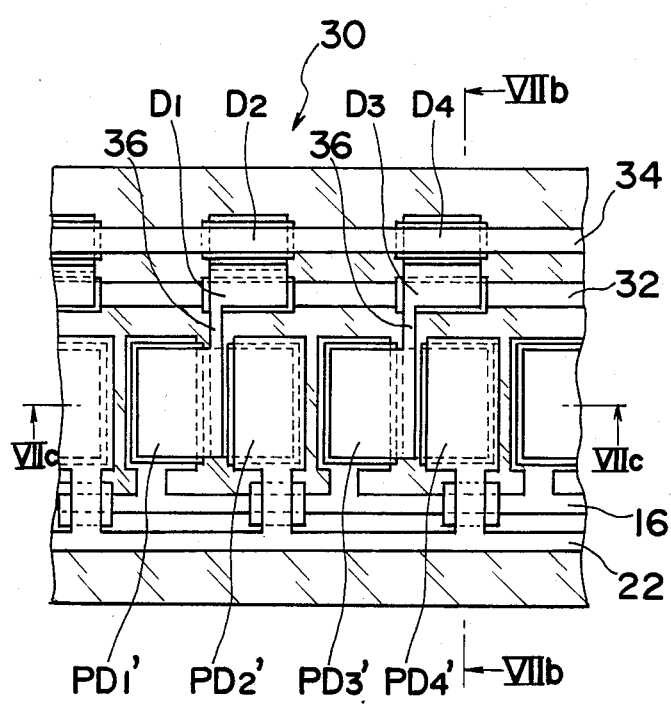
FIG. 7a is top plan view of a second embodiment of a focus detecting photoelectric device according to the present invention.
Figure 7B:
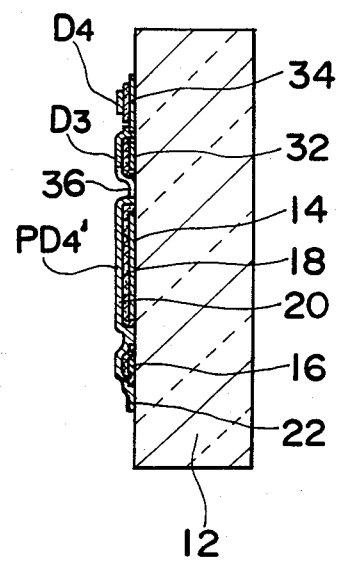
Figure 7C:
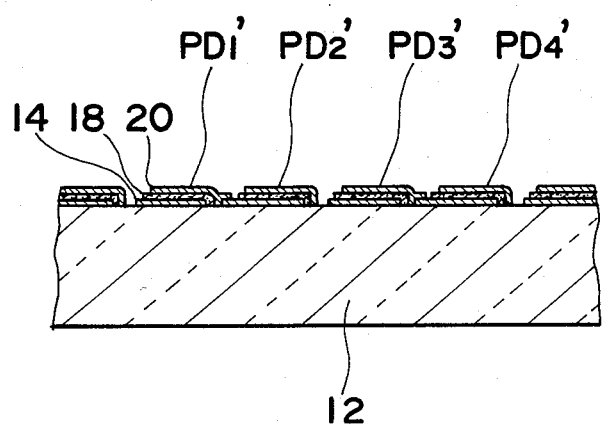

Referring to FIGS. 7a, 7b and 7c, there is shown a focus detecting photoelectric device 30 according to the second preferred embodiment of the present invention. The focus detecting photoelectric device 30 comprises a glass plate 12 and a plurality of photodiodes PD1', PD2', PD3', PD4', . . . , aligned in an array in pairs (PD1', PD2'; PD3', PD4'; in a similar manner described above. Each photodiode comprises a layer of transparent electrode 14 deposited directly on the glass plate 12 and formed by, e.g., an ITO layer, an amorphous silicon layer 18 deposited on the transparent electrode 14, and a non-transparent electrode 20 deposited on the amorphous silicon layer 18 and formed by, e.g., an aluminum film.

It is to be noted that the first photodiodes PD1', PD3', ... in each pairs are connected with each other by the runner electrode 16, and the second photodiodes PD2', PD4', ... in each pairs are connected with each other by the runner electrode 22.

It is also to be noted that first and second photodiodes, e.g., PD1' and PD2' in each pair are connected in series in the same direction between the runner electrodes 16 and 22.

The focus detecting photoelectric device 30 further comprises a plurality of diodes D1, D2, D3, D4, ..., located in pairs (D1, D2; D3, D4; ...) on the glass plate 12 at suitable positions adjacent the photodiodes in pairs.

It is to be noted that the first diodes D1, D3, ... in each pairs are connected with each other by a runner electrode 32, and the second diodes D2, D4, ... in each pairs are connected with each other by another runner electrode 34.

It is also to be noted the first and second diodes, e.g., D1 and D2 in each pair are connected in series in the same direction between the runner electrodes 32 and 34.

It is further to be noted that the number of diodes are equal to the number of photodiodes, so that each pair of photodiodes, e.g., PDI' and PD2' correspond to a pair of diodes, e.g., D1 and D2. A junction between the first and second photodiodes, e.g., PDI' and PD2' in one pair and a junction between the first and second diodes, e.g., D1 and D2 in corresponding pair are connected with each other by a bridging electrode 36.

A further detail of the focus detecting photoelectric device 30 will become apparent from the description below in connection with FIGS. 8a to 8d directed to the steps form manufacturing the device 30.

Figure 8A:
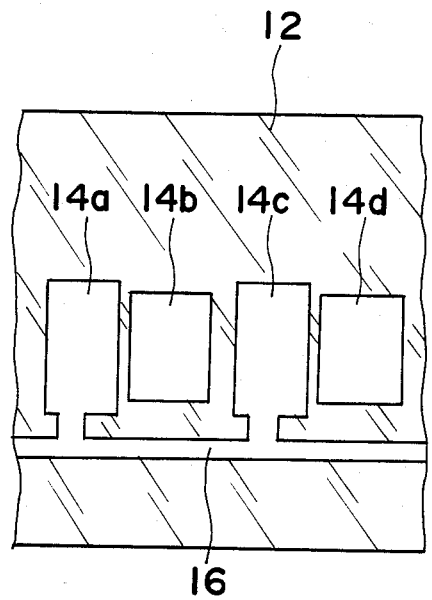

Referring particularly to FIG. 8a, the glass plate 12 is first deposited with ITO layer 14 in a pattern shown to define transparent electrodes 14a, 14b, 14c, 14d, ... for the photodiodes PD1', PD2', PD3', PD4', ... and the runner electrode 16 which connects every other transparent electrodes 14a, 14c, ....

Figure 8B:
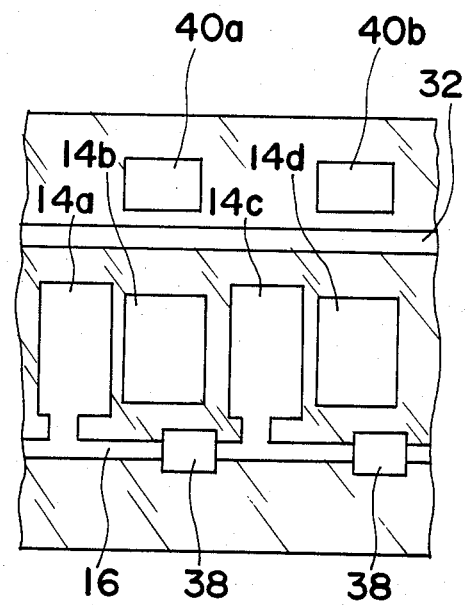

Then, as shown in FIG. 8b, an electrically insulation layer 38 is deposited crossingly over a section of the runner electrode 16 adjacent each transparent electrodes 14b, 14d, ..., which are not connected with the runner electrode 16. The insulation layers 38 are formed, e.g., by polyimide film.

After or before the deposition of the insulation layers 38, an aluminum layer is deposited directly on the glass plate 12 in a pattern shown in FIG. 8b to define non-transparent electrodes 40a, 40b, ... and runner electrode 32.

Figure 8C:
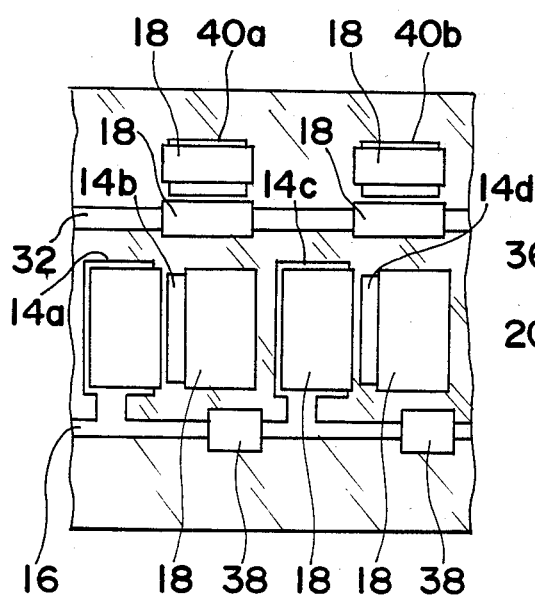

Thereafter, as shown in FIG. 8c, an amorphous silicon layer 18 is deposited on each of the transparent electrodes 14a, 14b, 14c, ..., non-transparent electrodes 40a, 40b, ..., and on the runner electrode 32 crossingly over sections immediately below the respective non-transparent electrodes 40a, 40b, ....

It is to be noted that the amorphous silicon layers 18 deposited on the transparent electrodes 14b and 14d do not entirely cover the corresponding transparent electrodes 14b and 14d such that a left-hand side portion of each of the electrodes 14b and 14d, when viewed in FIG. 8c, remain uncovered.

It is also to be noted that the amorphous silicon layer 18 deposited on each of the non-transparent electrodes 40a and 40b has such a configuration that its length, measured in the direction parallel to the longitudinal direction of the glass plate 12, is longer than that of the corresponding non-transparent electrode, and that its width, measured in the direction perpendicular to the longitudinal direction of the glass plate 12, is smaller than that of the corresponding non-transparent electrode so that a portion of each of the non-transparent electrode 40a, 40b, ... adjacent the runner electrode 32 remain uncovered.

Figure 8D:
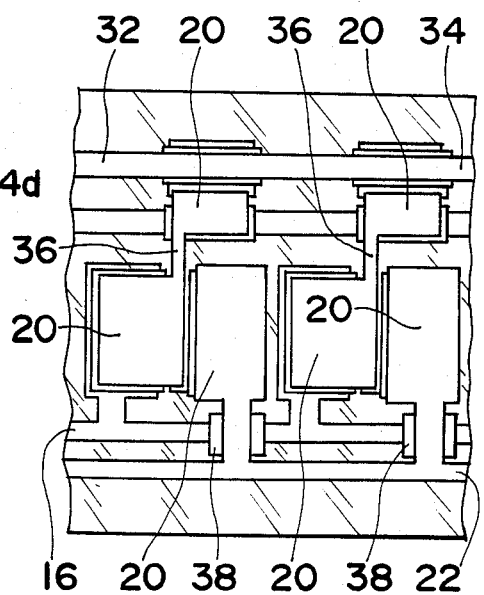

Then, as shown in FIG. 8d, an aluminum layer is deposited so as to define non-transparent electrodes 20 over each of the amorphous silicon layer 18, the runner electrodes 22 and 34, and the bridging electrodes 36.

It is to be noted that the non-transparent electrodes 20 deposited above the transparent electrodes 14a, 14c, ... extend, respectively, rightwards in FIG. 8d onto the transparent electrodes 14b and 14d at portions remained uncovered. This effects an electrical connection between the non-transparent electrode 20 of one photodiode of the pair and transparent electrode 14 of the other photodiode of the pair.

It is also to be noted that the non-transparent electrodes 20 deposited above the sections of the runner electrode 32 extend, respectively, upwardly in FIG. 8d onto the non-transparent electrodes 40a and 40b at portions remained uncovered. This effects an electrical connection between the non-transparent electrode 20 of one diode of the pair and non-transparent electrode 40 of the other diode of the pair.

It is further to be noted that the electrode portions extending from the runner electrode 22 towards each of the non-transparent electrodes 20 of the photodiodes cross over the insulation layer 38 so as to prevent an electric connection between runner electrodes 22 and 16.

Figure 9:
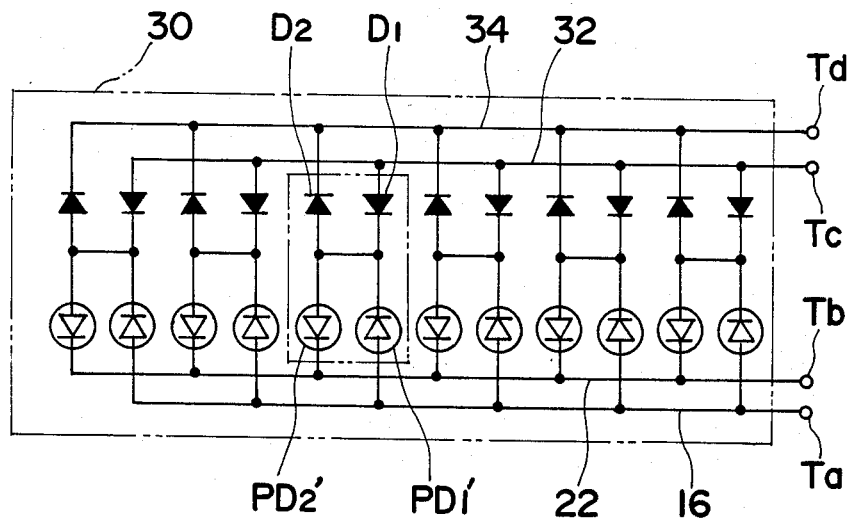

Referring to FIG. 9, there is shown an equivalent circuit of the above described focus detecting photoelectric device 30. A pair of photodiodes PD1' and PD2' and a pair of diodes D1 and D2 shown in FIG. 9 in a chain line block can be considered as corresponding to the amorphous silicon photodiodes PD1' and PD2' and amorphous silicon diodes D1 and D2, shown in FIG. 7a, respectively. As apparent from FIG. 9, the photodiodes PDI' and PD2' are connected in series between runner electrodes 16 and 22 in the same direction, and the diodes D1 and D2 are connected in series between runner electrodes 32 and 34 in the same direction. Furthermore, a junction between the photodiodes PD1' and PD2' and a junction between the diodes D1 and D2 are connected with each other. The runner electrodes 16, 22, 32 and 34 are shown as connected to terminals Ta, Tb, Tc and Td, respectively.

Figure 10:
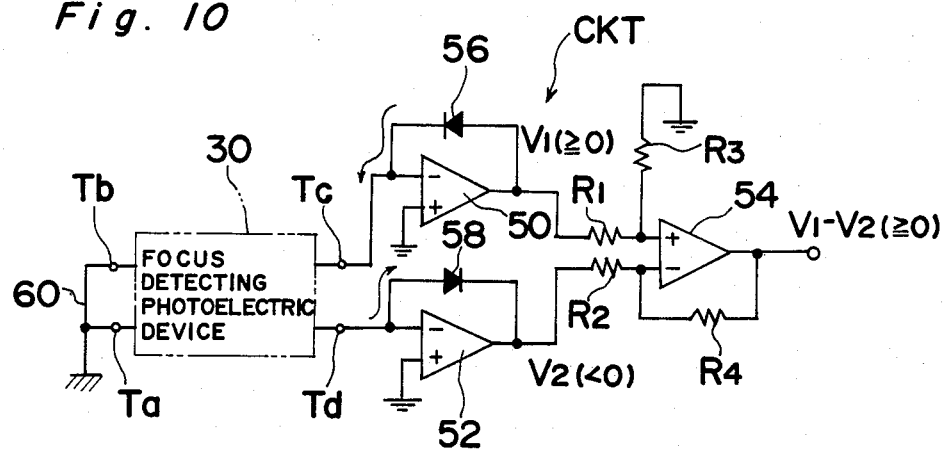

Referring to FIG. 10, there is shown a processing circuit CKT connected to the focus detecting photoelectric device 30. The circuit CKT comprises operational amplifiers 50, 52 and 54, diodes 56 and 58 and resistors R1, R2, R3 and R4. The operational amplifier 50 and diode 56 constitute a logarithmic compression type current-voltage converter. Similarly, the operational amplifier 52 and diode 58 constitute another logarithmic compression type current-voltage converter. As shown in FIG. 10, the diodes 56 and 58 are provided in opposite relation to each other so that the amplifier 50 produces a positive voltage signal V1 and the amplifier 52 produces a negative voltage signal V2. The operational amplifier 54, together with resistors R1, R2, R3 and R4, define a differential amplifier.

The terminal Tc of the focus detecting photoelectric device 30 is connected to the inverting input of the amplifier 50, and the terminal Td to the inverting input of the amplifier 52. Furthermore, the terminals Ta and Tb are connected with each other by a suitable wire 60 which is further connected to ground.

Next, the operation of the focus detecting photoelectric device 30 in combination with the processing circuit CKT is explained.

When an image is formed on the focus detecting photoelectric device 30, a photocurrent relative to the brightness of the impinging light is generated from each of the photodiodes PD1', PD2', . . . , effecting current flow from the terminal Tb through the photodiodes PD2' and PD1' to the terminal Ta.

Assuming that the image is out of focus, the brightness of the image on the photodiode PD1' and that on the photodiode PD2' are the same with each other. In this case, a photocurrent generated from the photodiode PD1' and that from the photodiode PD2' have the same amount and, therefore, no current will be applied to, or derived from, the current path between the photodiodes PD1' and PD2' through the diodes D1 and D2.

Next, assuming that the image is in-focus and that the image on the photodiode PD2' is brighter than that on the photodiode PD1'. In this case, the photodiode PD2' generates a photocurrent having a greater amount than that from the photodiode PD1'. Thus a difference current therebetween flows out from said path through the diode D2 to the terminal Td. The current produced from the terminal Td is fed through the diode 58 for effecting the logarithmic compression and is converted into voltage by the operational amplifier 52. Thus, the amplifier 52 produces a negative voltage V2 representing the current produced from the terminal Td. In this case, since no current is flowing through the terminal Tc, the amplifier 50 produces a zero level voltage signal V1. Then, the amplifier 54 subtracts the voltage signal V2 from the voltage signal V1 for producing a difference signal V1-V2. Since V1=0, the amplifier 54 produces a voltage signal −V2 which is a positive voltage signal.

In contrast to the above, if the image on the photodiode PD1' is brighter than that on the photodiode PD1', the photodiode PD1' greater amount than that from the photodiode PD2'. Thus a difference current therebetween flows into said path through the diode D1 from the terminal Tc. The current fed into the terminal Tc flows through the diode 56 for effecting the logarithmic compression and is converted into voltage by the operational amplifier 50. Thus, the amplifier 50 produces a positive voltage V1 representing the current fed into the terminal Tc. In this case, since no current is flowing through the terminal Td, the amplifier 52 produces a zero level voltage signal V1. Then, in the amplifier 54, the subtraction is carried out to produce a difference signal V1-V2. Since V2=0, the amplifier 54 in this case produces a voltage signal V1 which is a positive voltage signal.

In either one of the above described two cases, the differential amplifier 54 produces a voltage signal which is above zero. Although the above description of operation is directed only to the photodiodes PD1' and PD2' and diodes D1 and D2 shown in the chain line block, a similar operation is carried out in the other pairs in the focus detecting photoelectric device 30 and, therefore, the total current directed out from the diode D2 and other corresponding diodes flows out from the device 30 through the terminal Td, and the total current directed into the diode D2 and other corresponding diodes flows into the device 30 through the terminal Tc. As the image becomes sharp, the total current flows-out and flows-in becomes great, and when the current flow-in and flow-out take place at the same time, they effect synergistically on the circuit CKT to increase the output voltage from the differential amplifier 54.

Figure 11:
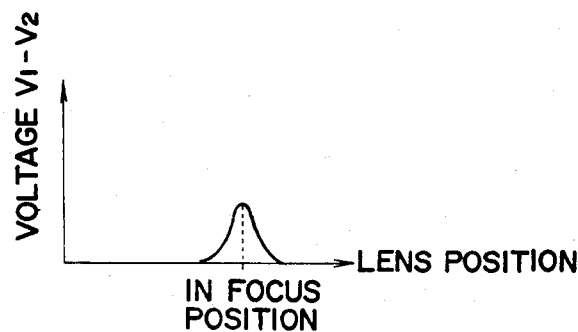
FIG. 11 is a graph showing a waveform of output obtained from the circuit of FIG. 10.

A graph of FIG. 11 shows an waveform of difference signal V1-V2 obtained from the differential amplifier 54, in which abscissa and ordinate represent, respectively, lens position and difference signal V1-V2. As apparent from the waveform, the output voltage V1-V2 shows a peak value when a lens is shifted to the in-focus position. Thus, by the detection of the peak point, it is possible to detect the in-focus condition of the image formed on the focus detecting photoelectric device 30.

Figure 12:
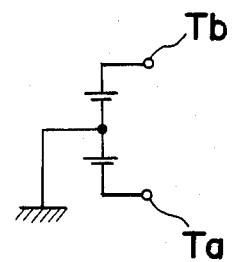
FIG. 12 is a circuit diagram which can be employed in the circuit of FIG. 10 in place of the wire 60.

It is to be noted that the terminals Ta and Tb, which have been described as connected to each other by a wire 60 and further to ground, can be connected to a source of voltage, as shown in FIG. 12, such that the terminal Tb is impressed with a positive voltage and the terminal Ta is impressed with a negative voltage. When the arrangement as shown in FIG. 12 is employed, the photodiodes PD1' and PD2' and other corresponding photodiodes are biased in reverse direction.

Figure 13:
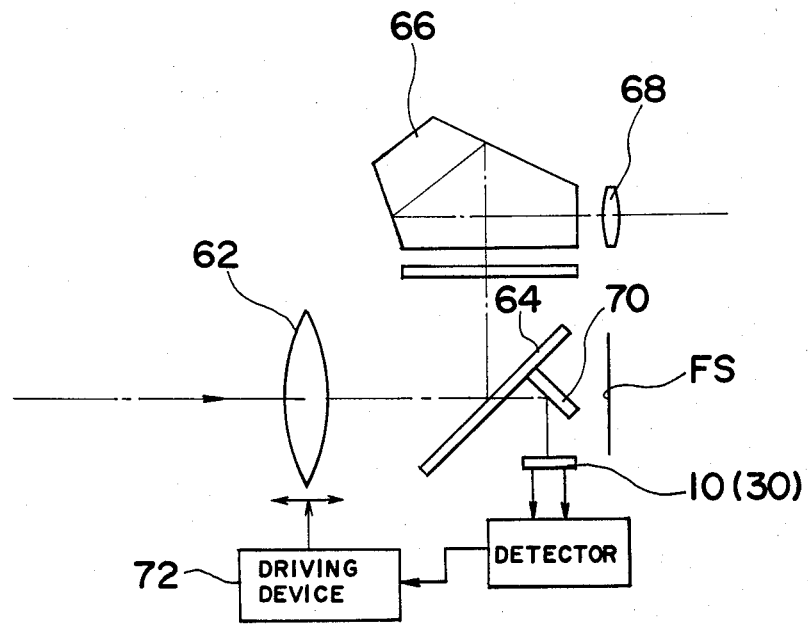

Referring to FIG. 13, there is shown a focus detecting system employing the focus detecting photoelectric device 10 or 30 described above, and the system is shown as employed in a single reflex camera. The single reflex camera generally includes a picture taking lens 62, a mirror 64, a pentaprism 66, and an eyepiece 68. The picture-taking lens 62 is provided in association with a driving device 72 which drives the lens 62 back and forth to change the focus condition. The mirror 64 has a half-mirror portion in its center for directing lights from the picture-taking lens 62 through the half-mirror to an auxiliary mirror 70. The lights reflected on the auxiliary mirror 70 are directed to the focus detecting photoelectric device 10 or 30.

It is to be noted that the distance of light path from the picture-taking lens 62 to the focus detecting photoelectric device 10 or 30 is equal to the distance from the picture-taking lens 62 to the film surface FS, so that the image formed on the focus detecting photoelectric device 10 or 30 and that on the film surface FS will be focused in the same condition.

The signal obtained from the focus detecting photoelectric device 10 or 30 is applied to a detector, such as a circuit CKT described above in connection with FIG. 10, to produce an in-focus signal when the image is focused sharply on the focus detecting photoelectric device 10 or 30. The in-focus signal is applied to the driving device 72 which then stops the lens shift to locate the picture-taking lens 62 to the proper focusing position.

Figure 14:
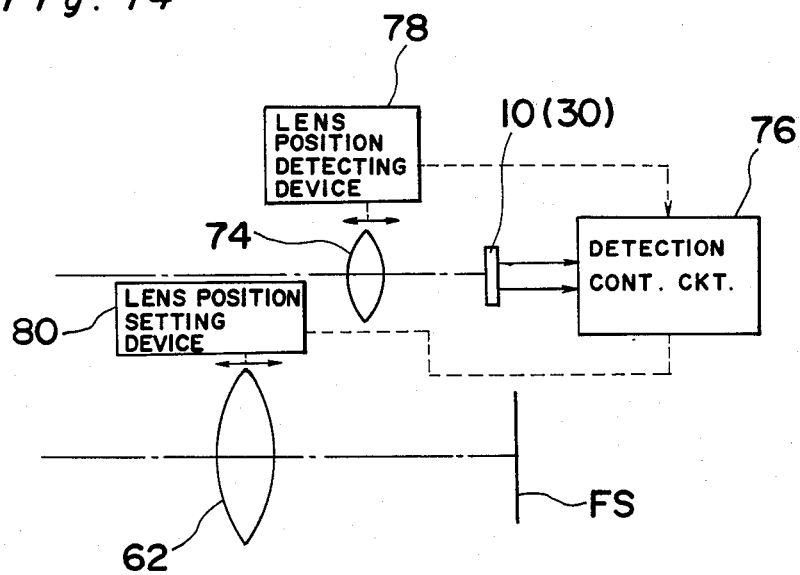
FIG. 14 is a view similar to FIG. 13 but particularly showing a modification thereof.

Referring to FIG. 14, there is shown another focus detecting system employing the focus detecting photoelectric device 10 or 30 described above, and the system is shown as employed in a range finder camera. The camera shown includes picture-taking lens 62 for forming an image on the film surface FS, and objective lens 74 for forming an image on the focus detecting photoelectric device 10 or 30. The signal produced from the device 10 or 30 is applied to a detection and control circuit 76 including, e.g., the above described circuit CKT of FIG. 10. The detection and control circuit 76 also receives a signal from a lens position detecting device 78 coupled to the lens 74, and applies lens position signal to a lens position setting device 80 coupled to the picture-taking lens 62. In operation, when the lens 74 is shifted manually or automatically, the lens position detecting device 78 incessantly supplies a signal representing the position of the lens 74 to the detection and control circuit 76 and, at the same time, the focus detecting photoelectric device 10 or 30 supplies focus signal to the detection and control circuit 74. The detection and control circuit 76 memorizes the position of the lens 74 at a moment when an in-focus signal is obtained from the focus detecting photoelectric device 10 or 30, and supplies the memorized lens position signal to the lens position setting device 80, which then shifts the picture-taking lens 62 to a position based on the in-focus signal. Thus, the picture-taking lens 62 can be shifted to a position for forming an in-focus image on the film surface FS.

According to the present invention, since the focus detecting photoelectric device is formed by an amorphous silicon layer 18, which is non-crystalline, it is possible to select any material for the substrate 12, such as a glass plate which is electrically non-conductive. Thus, it is possible to electrically insulate the photodiodes on the glass plate 12 from each other by introducing a suitable space between the photodiodes. Therefore, unlike photodiodes formed on the single crystal layer, photodiodes formed by the amorphous silicon layer on the glass plate will not produce any unwanted parasitical photodiodes within the device.

Furthermore, since the amorphous silicon photodiode has a thickness of several micron order, which is equal to several tenth of the thickness of the photodiodes formed by single crystal silicon layer, the space necessary to insulate the photodiodes can be very small and, therefore, it is possible to sample a very high spatial frequency component to increase the accuracy of the focus detection.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of appended claims.

What is claimed is:

1. A focus detecting photoelectric device comprising:
    a substrate formed by an electrically non-conductive material;
    a plurality of pairs of first and second photodiodes deposited adjacent to each other on said substrate, each of said photodiodes comprising:
        a first electrode layer deposited directly on said substrate;
        an amorphous silicon layer deposited on said first electrode layer; and
        a second electrode layer deposited on said amorphous silicon layer such that the amorphous silicon layer is sandwiched between said first and second electrode layers, said first and second photodiodes in each pair being connected in series to each other; and
    either said second electrode layer or a combination of said first electrode layer and said substrate being formed by transparent material for permitting impingement of light onto said amorphous silicon layer.

2. A focus detecting photoelectric device as claimed in claim 1, further comprising at least first and second diodes connected in series with each other, a junction between said first and second diodes being connected to a junction between said first and second photodiodes.

3. A focus detecting photoelectric device as claimed in claim 2, wherein said first and second diodes are deposited on said substrate, and are formed by amorphous silicon layers.

4. A focus detecting system for detecting a focus condition of an image formed by an objective lens on a plane by means of detecting the contrast between two adjacent portions of said image on the plane, said focus detecting system comprising:
    a focus detecting photoelectric device for receiving lights directed from said objective lens on said plain, said focus detecting photoelectric device comprising:
        a substrate formed by an electrically nonconductive material; and
        a plurality of photodiodes for generating a current in response to light impinging thereon, each photodiode having a photoelectric layer defined by an amorphous silicon layer, said plurality of photodiodes deposited on said substrate such that a light receiving face of said photodiodes substantially coincides with said plane, said plurality of photodiodes defining a plurality of units, each unit comprising first and second photodiodes located adjacent to each other, said first and second photodiodes in each unit having the same photoelectric characteristic with respect to each other and being connected in series to each other such that an anode of one of said first and second photodiodes is connected to a cathode of the other of said first and second photodiodes; and
    means for detecting a current flowing though each unit so as to detect said contrast said current flowing through each unit comprising said current generated by said first and second photodiodes comprising said unit.

5. A focus detecting system as claimed in claim 4, wherein each of said unit comprising:
    a pair of first and second electrode layers formed by electrically conductive material and deposited on said substrate adjacent to, but in separate relation to, each other;
    a pair of photoelectric layers each formed by amorphous silicon layer and deposited on said pair of first and second electrode layers, respectively;
    a pair of third and fourth electrode layers formed by electrically conductive material and deposited on said pair of amorphous silicon layers such that each of said pair of amorphous silicon layers being sandwiched between first and third electrode layers to define said first photodiode and between second and fourth electrode layers to define said second photodiode, respectively; and
    means for electrically connecting said first electrode layer with said fourth electrode layer.

6. A focus detecting system as claimed in claim 5, further comprising a first common electrode connected to said third electrode layer in each unit, and a second common electrode connected to said second electrode layer in each unit, said first and second common electrodes being connected to said current detecting means.

said current detecting means detecting a minimum current from said first and second common electrodes when said image on said focus detecting photoelectric device is focused most sharply to provide a high contrast between image sections on said photodiodes in units.

7. A focus detecting system as claimed in claim 6, where said photodiodes on said substrate are aligned in an array with photodiodes in a unit being spaced a first predetermined distance from each other, and photodiodes in two neighboring units being spaced a second predetermined distance from each other.

8. A focus detecting system as claimed in claim 7, wherein said first and second predetermined distances are approximately equal to each other.

9. A focus detecting system as claimed in claim 5, 6, 7 or 8, wherein said substrate is formed by a transparent and electrically non-conductive material, and wherein said first and second electrodes in each unit are formed by a transparent electrically conductive material, whereby said amorphous silicon layers receive lights passing through said substrate and said first and second electrodes.

10. A focus detecting system as claimed in claim 9, wherein each of said amorphous silicon layer comprises p-type amorphous silicon layer, i-type amorphous silicon layer and n-type amorphous silicon layer deposited in said order between said first and third electrode layers and between second and fourth electrode layers.

11. A focus detecting system as claimed in claim 5, 6, 7 or 8, wherein said third and fourth electrode layers in each unit are formed by a transparent electrically conductive material, whereby said amorphous silicon layers receive lights passing through said third and fourth electrode layers.

12. A focus detecting system as claimed in claim 4, wherein each of said units further comprises first and second diodes connected in series to each other such that an anode of one of said first and second diodes is connected to the other of said first and second diodes, a junction between said first and second diodes being connected to a junction between first and second photodiodes, whereby a difference current between currents generated by said first and second photodiodes in one unit flows through one of said first and second diodes, said difference current being relative to the degree of focus of the image formed on said first and second photodiodes.

13. A focus detecting system as claimed in claim 12, wherein said first and second diodes are deposited on said substrate at positions adjacent to said first and second photodiodes, respectively.

14. A focus detecting system as claimed in claim 13, wherein each of said first and second diodes comprises an amorphous silicon layer sandwiched between non-transparent electrodes.

15. A focus detecting system for detecting a focus condition of an image formed on a plain by an objective lens by the detection of contrast between two adjacent portions on said image on the plain, said focus detecting system comprising:
a focus detecting photoelectric device for receiving lights directed from said objective lens on said plane, said focus detecting photoelectric device comprising:
a substrate formed by an electrically non-conductive material;
a plurality of pairs of first and second electrodes formed by electrically conductive material and deposited closely adjacent to each other on said substrate;
photoelectric layers each formed by an amorphous silicon layer and deposited on each of said first and second electrodes;
a plurality of pairs of third and fourth electrodes formed by electrically conductive material and deposited on said amorphous silicon layer above said first and second electrodes, respectively, and each of said second electrodes is electrically connected with each of said third electrodes,
said amorphous silicon layers sandwiched between first and third electrodes respectively defining first photodiodes and said amorphous silicon layers sandwiched between second and fourth electrodes respectively defining second photodiodes; and
means for detecting currents flowing through each of said and second photodiodes so as to detect said contrast.

16. A focus detecting system as claimed in claim 15, wherein said substrate is formed by a transparent material, and said first and second electrodes are formed by a transparent material, whereby said amorphous silicon layers receive lights directed thereto through said substrate and said first and second electrodes, respectively.

17. A focus detecting system as claimed in claim 15, wherein each of said amorphous silicon layers is defined by layers of p-type amorphous silicon layer, i-type amorphous silicon layer and n-type amorphous silicon layer which are deposited in said order on each of said first and second electrodes.

18. A focus detecting system as claimed in claim 15, 16 or 17, wherein said first and second photodiodes are spaced a predetermined distance from each other on said substrate.

19. A focus detecting system as claimed in claim 15, further comprising a first runner electrode connected to said first electrode.

20. A focus detecting system as claimed in claim 19, further comprising a second runner electrode connected to said fourth electrode.

21. A focus detecting system as claimed in claim 15, wherein said third and fourth electrodes are formed by transparent material, whereby said first and second photodiodes receive lights directed thereto through said third and fourth electrodes, respectively.

22. A focus detecting system as claimed in claim 15, wherein said current detecting means comprises means for detecting current flowing through first and second photodiodes connected in series, whereby said detecting means detects the highest contrast when the detected current shows a minimum value.

23. A focus detecting system for detecting a focus condition of an image formed on a plane by an objective lens by the detection of contrast between two adjacent portions on said image on the plane, said focus detecting system comprising:
a focus detecting photoelectric device for receiving lights directed from said objective lens on said plane, said focus detecting photoelectric device comprising:
a substrate formed by an electrically non-conductive material;
a plurality of photoelectric units, each of said photoelectric units having first photodiode, second photodiode, first diode and second diode and comprising:

first and second electrodes formed by electrically conductive material and deposited adjacent to each other on said substrate;

third and fourth electrodes formed by nontransparent and electrically conductive material and deposited on said substrate;

four photoelectric layers each formed by an amorphous silicon layer and deposited on each of said first, second, third and fourth electrodes;

fifth and sixth electrodes formed by electrically conductive material and deposited on said amorphous silicon layer above said first and second electrodes, respectively;

seventh and eighth electrodes formed by nontransparent and electrically conductive material and deposited on said amorphous silicon layer above said third and fourth electrodes, respectively; and means for electrically connecting said first electrode with each of said third, sixth and eighth electrodes, said amorphous silicon layer deposited between first and fifth electrodes defining said first photodiode, said amorphous silicon layer deposited between second and sixth electrodes defining said second photodiodes, said amorphous silicon layer deposited between third and seventh electrodes defining said first diode, and said amorphous silicon layer deposited between fourth and eighth electrode defining said second diode; and means for detecting a current which is generated by each of said first and second photodiodes, said current flowing through each of said first and second diodes, so as to detect said contrast.

24. A focus detecting system as claimed in claim 23, wherein said substrate is formed by a transparent material, said first and second electrodes are formed by a transparent material, and said third, fourth, fifth, sixth, seventh and eighth electrodes are formed by a nontransparent material, whereby said first and second photodiodes receive lights directed thereto through said substrate and said first and second electrodes, respectively.

25. A focus detecting system as claimed in claim 23, wherein each of said four amorphous silicon layers is defined by layers of p-type amorphous silicon layer, i-type amorphous silicon layer and n-type amorphous silicon layer which are deposited in said order on each of said first, second, third and fourth electrodes.

26. A focus detecting system as claimed in claim 23, 24 or 25, wherein said first and second photodiodes are spaced a predetermined distance from each other.

27. A focus detecting system as claimed in claim 23, further comprising a first runner electrode connected to said second electrode.

28. A focus detecting system as claimed in claim 27, further comprising a second runner electrode connected to said fifth electrode.

29. A focus detecting system as claimed in claim 28, further comprising a third runner electrode connected to said seventh electrode.

30. A focus detecting system as claimed in claim 29, further comprising a fourth runner electrode connected to said fourth electrode.

31. A focus detecting system as claimed in claim 30, wherein said first and second runner electrodes are connected with each other.

32. A focus detecting system as claimed in claim 31, wherein said first and second runner electrodes are connected with low and high biasing voltages, respectively.

33. A focus detecting system as claimed in claim 23, wherein said current detecting means comprises means for detecting current difference between currents flowing through said first and second photodiodes, whereby said detecting means detect the highest contrast when the detected current difference is maximum.

* * * * *